United States Patent [19]

Deguchi

[11] Patent Number: 5,266,126

[45] Date of Patent: Nov. 30, 1993

[54] SEMICONDUCTOR DEVICE AND METHOD FOR MANUFACTURING THE SAME

[75] Inventor: Mikio Deguchi, Itami, Japan

[73] Assignee: Mitsubishi Denki Kabushiki Kaisha, Tokyo, Japan

[21] Appl. No.: 894,955

[22] Filed: Jun. 8, 1992

[30] Foreign Application Priority Data

Nov. 22, 1991 [JP] Japan ................... 3-334354

[51] Int. Cl.$^5$ ................. H01L 31/04; H01L 31/0368; H01L 31/18
[52] U.S. Cl. .................................. 136/256; 136/258; 437/4; 437/228; 437/233; 437/967; 257/49; 257/75
[58] Field of Search ............ 136/256, 258 PC; 437/4, 437/228, 233–234, 974, 967; 257/49, 75

[56] References Cited

U.S. PATENT DOCUMENTS 4,128,680 12/1978 Heaps et al. .................... 428/137

FOREIGN PATENT DOCUMENTS 2939348 4/1980 Fed. Rep. of Germany ...... 136/258 PC

OTHER PUBLICATIONS

Liaw et al, "Purification Of Metallurgical Grade Silicon By The Thermomigration Of Impurity Clusters", Solar Cells, No. 10, 1983, pp. 119–128.
Kumar et al, "The Effect Of Heat Treatment On Redistribution Of Fast Duffusing Impurities In Polycrystalline Silicon", Journal of Applied Physics, vol. 64, No. 2, Jul. 1988, pp. 942–944.
V. Y. Doo, J. Electrochem. Soc., vol. 111, pp. 1196–1198 (Oct. 1964).

Primary Examiner—Aaron Weisstuch
Attorney, Agent, or Firm—Leydig, Voit & Mayer

[57] ABSTRACT

A semiconductor device includes a porous, electrically insulating substrate, a semiconductor film disposed on the substrate, and a metal filling the pores of the substrate, the metal contacting the semiconductor film at the interface of the substrate and the semiconductor film.

20 Claims, 5 Drawing Sheets

SEMICONDUCTOR DEVICE AND METHOD FOR MANUFACTURING THE SAME

FIELD OF THE INVENTION

The present invention relates to a semiconductor device disposed on a substrate and, more particularly, to a structure for electrically connecting a semiconductor film to a substrate, especially when an insulating substrate is used, and a method for manufacturing the device

BACKGROUND OF THE INVENTION

FIGS. 4(a) and 4(b) are sectional views showing the structure of a conventional semiconductor device and a method for manufacturing it. Referring to FIG. 4(a), reference numeral 31 designates a substrate on which a semiconductor film 32 is formed. An electrically conductive material is used for the substrate 31 because it serves as an electrode of the semiconductor device when, for example, the semiconductor device is a solar cell.

Referring to FIG. 4(b), the semiconductor film 32 having a thickness of, for example, 30 to 50 microns is formed on the substrate 31 having a thickness of, for example, 0.2 to 0.5 millimeter, as shown in FIG. 4(a). Then, a pn junction and an electrode are formed on the semiconductor film 32 and the semiconductor device is completed.

When polycrystalline silicon is used as the material of the semiconductor film 32, the process for forming the semiconductor film 32 generally requires a high temperature. For example, with silicon, a temperature of at least 600° C. is necessary to form a polycrystalline film by chemical vapor deposition (CVD). If the film has to be formed in a short time, a still higher temperature is necessary. In addition, when the semiconductor film 32 is recrystallized, since the semiconductor film has to be temporarily heated to a melting point of silicon, a still higher processing temperature is used. The substrate 31 must bear up against such a high temperature.

Crystalline silicon, quartz, carbon, ceramics, and the likes are examples of materials capable of bearing up against high temperatures. However, since the substrate 31 is an electrode, it has to be electrically conductive, such as crystalline silicon, carbon, a conductive ceramic, or the like. However, these materials are comparatively expensive. If they are used as the substrate, cost is increased which is contrary to the objective of reducing semiconductor volume and cost.

When a material different from that of the semiconductor film 32 is used for the substrate, when the semiconductor film 32 is formed or during another high temperature process for forming the semiconductor device, the substrate material or a substance contained in the substrate diffuses into the semiconductor film 32 from the substrate 31 as an impurity. Especially, metallic impurities, such as iron, copper, and calcium, cause problems. More specifically, almost all of these impurities act as trapping centers for minority carriers or cause crystalline defects which adversely affect the semiconductor device. Even if the same material as the semiconductor film 32 is used for the substrate, if a semiconductor material having low purity is used for the substrate 31 in order to reduce cost, impurities will also diffuse into the semiconductor film 31.

FIGS. 5(a)–5(d) are sectional views showing manufacturing steps for a structure in which problems in the prior art are solved. In FIG. 5(d), the same reference numerals as in FIG. 4(b) designate the same or corresponding parts. A barrier layer 34 having a thickness of approximately 1 to 2 microns and formed of, for example, silicon dioxide, silicon nitride, or laminated layers of them is formed on the substrate 31 shown in FIG. 5(a) by a CVD method. Then, since the silicon dioxide film or the silicon nitride film is an insulating film, openings 35 are formed by etching desired parts of the barrier layer 34 using photolithography, as shown in FIG. 5(c), to electrically connect the semiconductor film 32 to the substrate 31. Thereafter, the semiconductor film 32 is formed using the same step as in FIG. 4(b), now illustrated in FIG. 5(d). During the high temperature process for forming the semiconductor film 32, the barrier layer prevents harmful impurities from diffusing from the substrate 31 into the semiconductor film 32.

However, since the semiconductor film 32 is directly in contact with the substrate 31 in the openings 35 in the barrier layer 34, impurities in the substrate 31 diffuse into the semiconductor film 32 through the openings as in the conventional example shown in FIG. 4(b). Therefore, even if contact between the semiconductor film 32 and the substrate 31 is limited to the openings of the barrier layer 34 and the degree of mixing of the impurity is reduced because the contact; area is reduced, the problem is not completely solved.

The conventional semiconductor device and manufacturing method described above do not completely prevent harmful impurities from diffusing from the substrate into the semiconductor film. However, if a substrate formed of a material having no such harmful impurity is used, the substrate is expensive and the semiconductor device cannot be manufactured at low cost.

SUMMARY OF THE INVENTION

The present invention was made to solve the above problems and it is an object of the present invention to provide a semiconductor device and a method for manufacturing the semiconductor device in which an impurity in a substrate is prevented from diffusing into a semiconductor film while the semiconductor film is being formed on the substrate and in which the cost of the semiconductor device is low.

Other objects and advantages of the present invention will become apparent from the detailed description given hereinafter. It should be understood, however, that the detailed description and specific embodiments are given by way of illustration only since various changes and modifications within the spirit and scope of the invention will become apparent to those skilled in the art from this detailed description.

A semiconductor device according to the present invention comprises a substrate formed of a porous insulator, a semiconductor film disposed on the substrate, and a metal filling the pores of the substrate. The metal is precipitated on the substrate surface and contacts the back surface of the semiconductor film to electrically connect the semiconductor film to the back surface of the substrate.

In addition, a method for manufacturing a semiconductor device according to the present invention comprises the steps of forming a semiconductor film on a substrate formed of a porous insulator, filling the pores of the substrate with a metal, and precipitating the metal at the substrate surface on which the semiconductor film is formed so that the metal is in contact with the semiconductor film.

According to the present invention, the semiconductor film is formed on the porous insulating substrate and a metal fills the pores of the substrate. The metal is precipitated at the substrate surface so that it contacts the back surface of the semiconductor film to electrically connect the semiconductor film to the back surface of the substrate. Thus, a semiconductor device using a semiconductor film free of impurities from the substrate is achieved.

In addition, according to the present invention, since the pores of the substrate are filled with the metal electrically contacting the semiconductor film after the semiconductor film is formed in a high temperature process, the impurities are prevented from diffusing from the substrate into the semiconductor film during the manufacturing process.

DETAILED DESCRIPTION OF PREFERRED EMBODIMENTS

Figure 1:
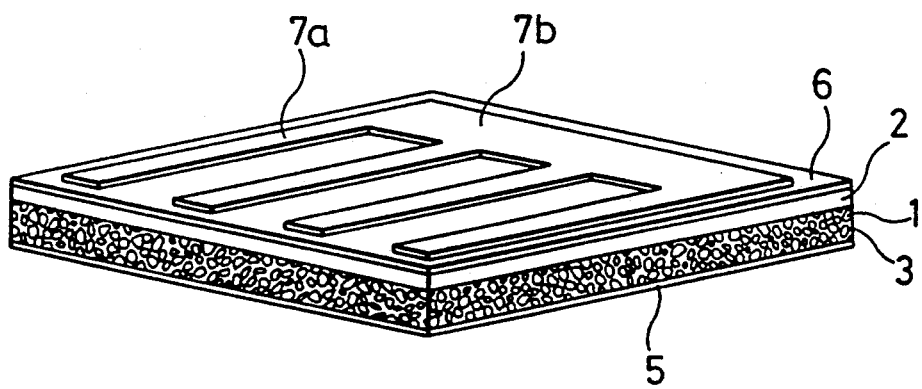
FIG. 1 is a perspective view of a thin film solar cell according to a first embodiment of the present invention.

FIG. 1 is a perspective view showing a thin film solar cell in accordance with an embodiment of the present invention. A substrate 1 formed of a porous insulator has a semiconductor film 2, which includes a pn junction and contributes to power generation, disposed on it. A surface protection film 6 reducing reflection of the incident light is disposed on the semiconductor film 2. An upper electrode comprising a grid electrode 7a for collecting photoelectric current generated at the semiconductor film 2 and a bus electrode 7b for gathering the current collected by the grid electrode 7a is disposed on the surface of the semiconductor film 2. In addition, a lower electrode 5 is disposed on the back surface of the substrate 1. The back surface of the semiconductor film 2 is electrically connected to the lower electrode 5 by a metal 3 that fills the pores of the substrate 1.

Figure 2A:
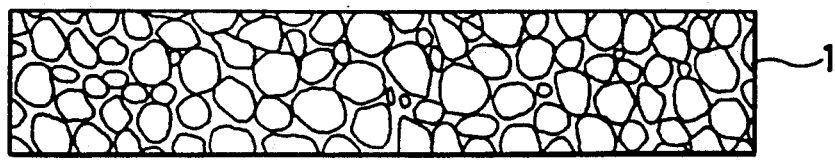
FIGS. 2(a)-2(c) are sectional views showing a method for manufacturing the thin film solar cell according to the first embodiment of the present invention.
Figure 2B:
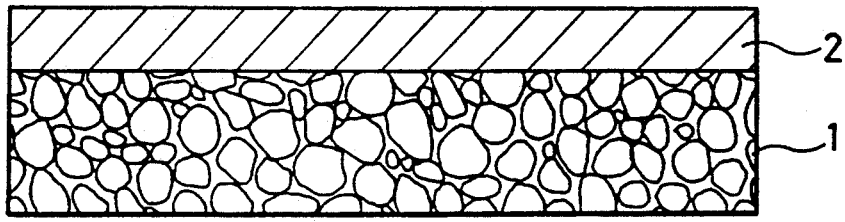
Figure 2C:
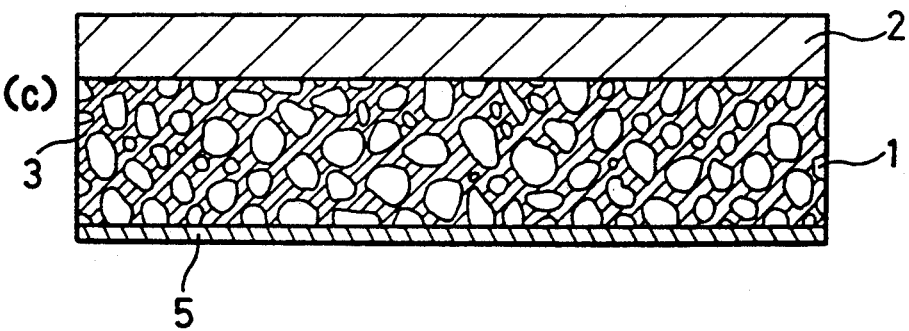

FIGS. 2(a)-2(c) are sectional views of steps of manufacturing a semiconductor device according to an embodiment of the present invention. The same reference numerals as in FIG. 1 designate the same or corresponding parts.

Referring to FIG. 2(a), the substrate 1 is formed of a porous insulator, such as porous alumina, having a thickness of 0.2 to 0.5 mm. Porous alumina is common as a ceramic material and its cost is relatively low. With alumina, the substrate can be formed within a wide range of parameters in which apparent porosity is 0 to 50% and grain size is from 1 micron or less to several tens of microns. Since smoothness of the surface of the substrate 1 is determined by porosity and grain size, a material having appropriate porosity and grain size is used in accordance with the thickness of the semiconductor film 2 on the substrate 1. For example, when the semiconductor film 2 has a thickness of approximately 30 microns, an alumina sintered body having a grain size of approximately one-tenth the film thickness, that is, having a grain size of approximately several microns may be used as the substrate 1. Alternatively, only the surface of the substrate 1 has such a grain size and other parts of the substrate may have a larger grain size. Thus, the porosity of the substrate 1 can be adjusted to an appropriate range.

Referring to FIG. 2(b), the semiconductor film 2 having a thickness of approximately 30 to 50 microns is formed on the substrate 1 shown in FIG. 2(a). For example, the semiconductor film may be polycrystalline silicon formed by a CVD method at a temperature of 1,000° C. or higher. Although the grain size of the polycrystalline silicon film formed by the CVD method varies depending on the substrate temperature at the time of formation thereof, it is normally less than 1 micron. However, effective performance cannot be obtained with this small grain size. In this case, the semiconductor film 2 is heated to 1,400° C. or more, melted, and recrystallized to enlarge its grain size. Since alumina is resistant to heat up to the melting point of silicon, in this embodiment of the present invention, silicon can be easily melted and recrystallized.

The semiconductor film 2 is then processed at a high temperature, such as in a thermal oxidation or impurity diffusion step, as necessary to form a semiconductor device. When the solar cell shown in FIG. 1 is formed, the process corresponds to diffusing an impurity into the semiconductor film 2, forming a pn junction by forming another semiconductor film having an opposite conductivity type on the semiconductor film 2, or forming a surface protection film and a surface electrode. After the high temperature process, referring to FIG. 2(c), the pores of the porous substrate 1 are filled with the metal 3 and the metal 3 is precipitated at the surface of the substrate 1 on which the semiconductor film 2 is formed. Thus, the semiconductor film 2 is electrically connected to the metal 3. Then, a back surface electrode 5 having a thickness of approximately several tens of microns and comprising the same material as the metal 3 is formed on the back surface of the substrate 1, that is, the surface opposite to the surface on which the semiconductor film 2 is disposed. Thus, the semiconductor device is completed.

In order to impregnate the pores of the substrate 1 with the metal 3, the substrate 1 is immersed in the molten metal 3 and the ambient pressure is reduced to extract gas from the pores of the substrate 1. Then, the ambient is returned to atmospheric pressure or above so that the pores are filled with the molten metal 3. In order to perform this step at a comparatively low temperature, it is preferable that the metal 3 have a melting point as low as possible. Examples of such metals are tin, solder, indium, and aluminum.

According to the first embodiment of the present invention, since the high temperature process which is necessary to form the semiconductor device is performed before the substrate is filled with the metal 3, the metal 3 does not diffuse and mix into the semiconductor film 2 as an impurity during high temperature processing.

Although the semiconductor film 2 is not in contact with the metal 3 during the high temperature processing in the first embodiment, it is directly in contact with the substrate 1 so that an impurity contained in the substrate 1 could diffuse into the semiconductor film 2 if the purity of the substrate 1 is not high enough.

Figure 3A:
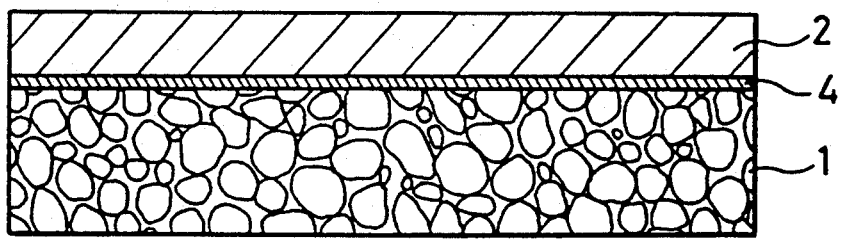
FIGS. 3(a)-3(c) are sectional views showing a method for manufacturing a semiconductor device according to a second embodiment of the present invention.
Figure 3B:
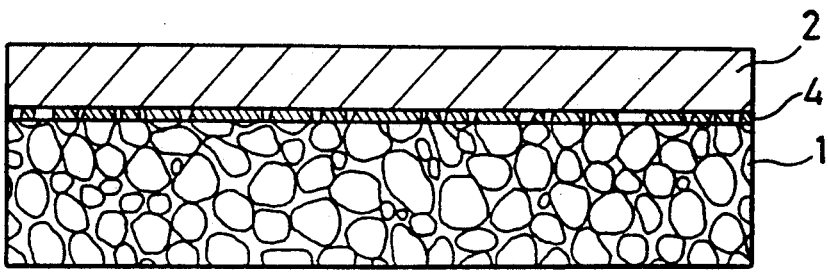
Figure 3C:
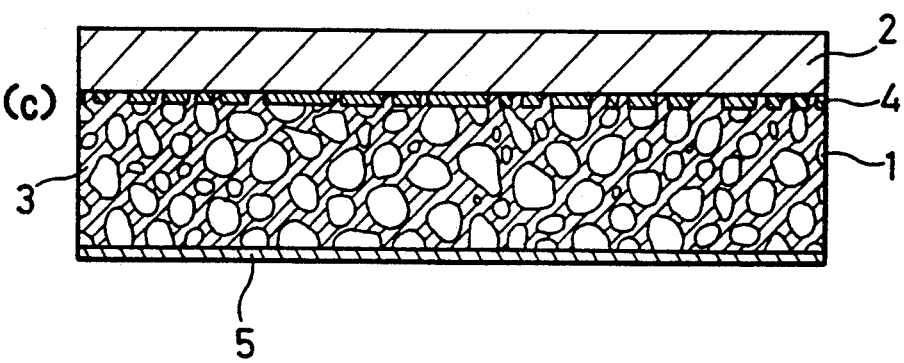
Figure 4A:
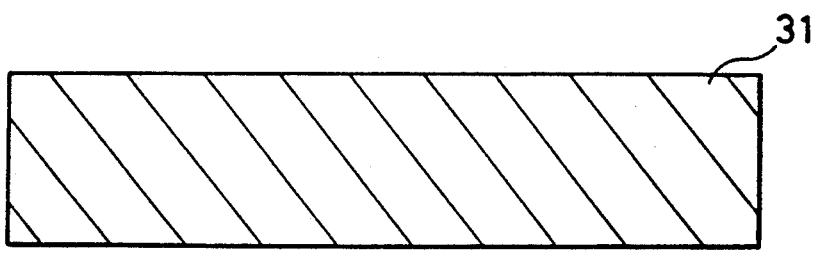
FIGS. 4(a) and 4(b) are sectional views showing a method for manufacturing a conventional semiconductor device.
Figure 4B:
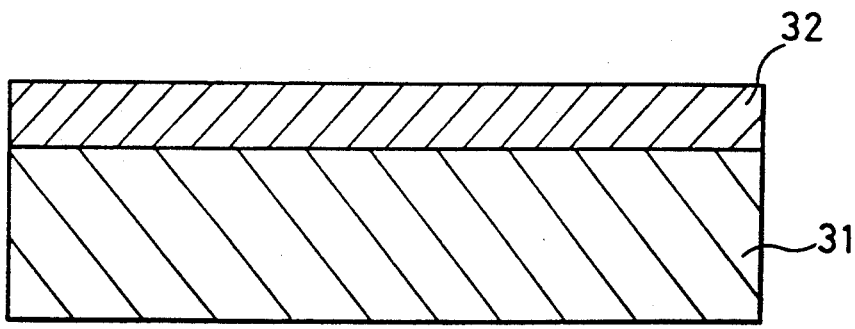
Figure 5A:
FIGS. 5(a)-5(d) are sectional views showing a method for manufacturing another conventional semiconductor device.
Figure 5B:
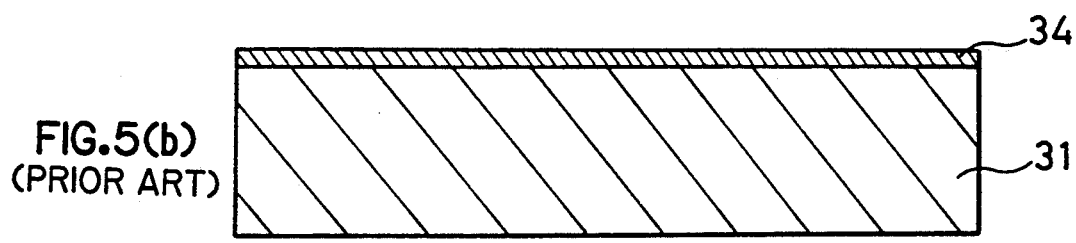
Figure 5C:
Figure 5D:
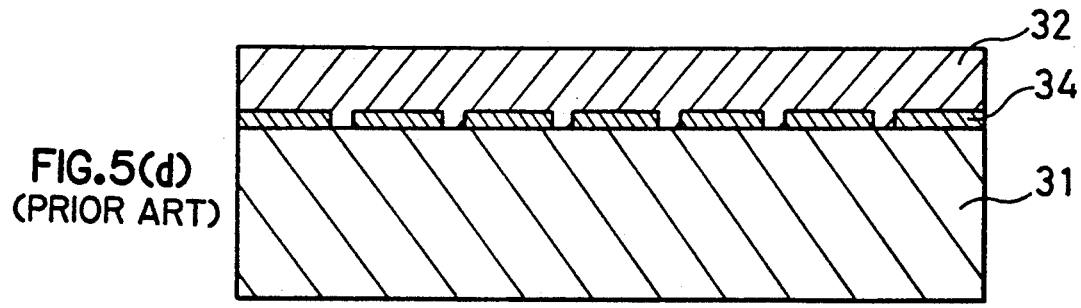

FIGS. 3(a) to 3(c) are sectional views of steps of manufacturing a semiconductor device according to a second embodiment of the present invention which solves a problem of the first embodiment shown in FIG. 2(c). Referring to FIG. 3(c), the same reference numerals as in FIG. 2(c) designate the same or corresponding parts and reference numeral 4 designates a barrier layer.

A barrier layer 4 having a thickness of, for example, 1 to 2 microns is formed on the surface of the substrate 1 by the CVD method and then the semiconductor film 2 is formed on the barrier layer 4, as shown in FIG. 3(a) in this second embodiment of the present invention. As the barrier layer 4, for example, a silicon dioxide film, a silicon nitride film, or a film of laminated layers of silicon dioxide and silicon nitride can be used. In this state, the high temperature process which is necessary to form the semiconductor device is performed. Since the barrier layer 4 is interposed between the semiconductor film 2 and the substrate 1 and there are no openings in the barrier layer 4, even if a harmful impurity is contained in the substrate 1, the impurity is prevented from diffusing from the substrate 1 into the semiconductor film 2 during the high temperature process.

Referring to FIG. 3(b), the barrier layer 4 on the pores of the substrate 1 is removed by introducing an etchant for dissolving the barrier layer 4 into the pores of the porous substrate 1. When the barrier layer 4 is silicon dioxide or silicon nitride, hydrofluoric acid can be used as the etchant. When the etchant is a liquid, as in the step of filling the porous substrate 1 with the metal 3 in the first embodiment of the present invention, the substrate 1 is immersed in the etchant and gas in the pores of the substrate is extracted by reducing the pressure in the ambient. The reduced pressure in the pores absorbs the etchant. In addition, when the etchant is a gas, after the ambient is evacuated, the etchant is introduced so that the etchant percolates through the pores. In the step of removing the barrier layer 4, if etching is carried out for too long a time, the whole of the barrier layer 4 is dissolved so that etching should be stopped when the barrier layer 4 on the pores is removed and the semiconductor film 2 on that part is exposed.

Referring to FIG. 3(c), the porous substrate 1 is filled with the metal 3 by the same method as in the first embodiment of the present invention. Since the barrier layer 4 is absent at the pores of the substrate 2, the metal 3 is in contact with the semiconductor film 2 there, whereby electrical contact with the semiconductor film 2 is achieved. Then, the back surface electrode 5 is formed on the back surface of the substrate 1 by the same step as in the first embodiment of the present invention. Thus, the semiconductor device is completed.

According to the second embodiment of the present invention, since the entire surface of the substrate 1 is covered with the barrier layer 4 during the high temperature process for forming the semiconductor device, even if the purity of the substrate 1 is not high enough and a harmful impurity is contained in it, the impurity is prevented from diffusing into the semiconductor film 2 so that the problem with the first embodiment is solved.

Although the substrate is formed of porous alumina and the semiconductor film is formed of polycrystalline silicon in the embodiments of the present invention described above, those materials may be other ceramic materials or semiconductor materials. The structure of the semiconductor device and its manufacturing method of the present invention can be implemented using other materials.

In addition, even if the method for forming the semiconductor film and for filling the substrate with metal is different from the method described above, the same results can be achieved.

As described above, the semiconductor device according to the present invention comprises a porous insulating substrate, a semiconductor film disposed on the substrate, and a metal filling the pores of the substrate so that the semiconductor film is electrically connected to the back surface of the substrate by the metal which is precipitated on the substrate surface and in contact with the back surface of the semiconductor film. Thus, there is provided a semiconductor device with an inexpensive semiconductor film into which no impurity diffuses from the substrate.

In addition, a method for manufacturing a semiconductor device according to the present invention comprises the steps of forming a semiconductor film on a porous insulating substrate, filling the pores of the substrate with a metal, and precipitating the metal on the substrate surface on which the semiconductor film is formed so that the metal contacts the semiconductor film. Thus, since the pores of the substrate are filled with the metal electrically contacting the semiconductor film after the high temperature process forming the semiconductor film or the semiconductor device has been carried out, harmful impurities are prevented from diffusing into the semiconductor film during the high temperature process, whereby a semiconductor device having excellent performance is provided.

What is claimed is:
1. A semiconductor device comprising:
a porous, electrically insulating substrate having opposed front and rear surfaces and including pores forming passages extending through said substrate from the front surface to the rear surface;
a semiconductor film disposed on the front surface of said substrate; and
a metal disposed within the pores of said substrate, contacting said semiconductor film at the front surface of said substrate, and extending through the pores of said substrate to the rear surface of said substrate whereby electrical contact to said semiconductor film can be made at the rear surface of said substrate.

2. A semiconductor device according to claim 1 comprising a barrier layer comprising at least one layer disposed between only parts of said semiconductor film and said substrate at the front surface of said substrate, said metal contacting said semiconductor film where said barrier layer is absent at the front surface of said substrate.

3. A semiconductor device according to claim 2 wherein said barrier layer is selected from the group consisting of silicon dioxide, silicon nitride, and laminated films of silicon dioxide and silicon nitride.

4. A semiconductor device according to claim 2 wherein said substrate comprises alumina.

5. A semiconductor device according to claim 2 wherein said metal is selected from the group consisting of tin, solder, indium, and aluminum.

6. A semiconductor device according to claim 2 wherein said semiconductor film is silicon.

7. A semiconductor device according to claim 1 wherein said substrate comprises porous alumina.

8. A semiconductor device according to claim 7 wherein said metal is selected from the group consisting of tin, solder, indium, and aluminum.

9. A semiconductor device according to claim 7 wherein said semiconductor film is silicon.

10. A semiconductor device according to claim 1 wherein said metal is selected from the group consisting of tin, solder, indium, and aluminum.

11. A semiconductor device according to claim 1 wherein said semiconductor film is silicon.

12. A semiconductor device according to claim 11 wherein said silicon semiconductor film is polycrystalline and has a grain size that is increased by recrystallization.

13. A semiconductor device according to claim 11 wherein said semiconductor includes a pn junction formed by diffusion of an impurity into part of said semiconductor film.

14. A semiconductor device according to claim 13 comprising an upper electrode and a rear surface electrode disposed on said semiconductor film and the rear surface of said substrate, respectively.

15. A semiconductor device according to claim 1 wherein said semiconductor film includes a pn junction formed by diffusion of an impurity into part of said semiconductor film.

16. A method for manufacturing a semiconductor device comprising the steps of:
    forming a semiconductor film on a front surface of a porous, electrically insulating substrate having a rear surface opposite the front surface and pores forming passages extending through said substrate from the front surface to the rear surface; and
    after forming said semiconductor film, filling the pores of said substrate with a metal contacting said semiconductor film and extending to the rear surface of said substrate whereby electrical contact to said semiconductor film can be made at the rear surface of said substrate.

17. A method for manufacturing a semiconductor device according to claim 16 including filling the pores of said substrate with a metal by evacuating the ambient of said substrate while said substrate is immersed in molten metal.

18. The method of claim 16 including forming a pn junction in said semiconductor film and attaching a first electrode to said film and a second electrode to said metal at the rear surface of said substrate.

19. A method for manufacturing a semiconductor device comprising the steps of:
    forming a barrier layer comprising at least one layer on all of a front surface of a porous, electrically insulating substrate having a rear surface opposite the front surface and pores forming passages extending through said substrate from the front surface to the rear surface;
    forming a semiconductor film on said barrier layer;
    removing the part of said barrier layer at the pores at the front surface of said substrate by introducing an etchant into the pores; and
    filling the pores of said substrate with a metal contacting said semiconductor film at the front surface and extending in the pores to the rear surface of said substrate whereby electrical contact to said semiconductor film can be made at the rear surface of said substrate.

20. The method of claim 19 including, before removing part of said barrier layer, forming a pn junction in said semiconductor film and, after filling the pores of said substrate with a metal, attaching a first electrode to said semiconductor film and a second electrode to said metal at the rear surface of said substrate.

* * * * *